(12) United States Patent
Gonzalez et al.

(10) Patent No.: US 6,500,744 B2
(45) Date of Patent: *Dec. 31, 2002

(54) METHODS OF FORMING DRAM ASSEMBLIES, TRANSISTOR DEVICES, AND OPENINGS IN SUBSTRATES

(75) Inventors: Fernando Gonzalez, Boise; Er-Xuan Ping, Meridian, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,670

(22) Filed: Sep. 2, 1999

(65) Prior Publication Data

US 2002/0072208 A1 Jun. 13, 2002

(51) Int. Cl.[7] .......................................... H01L 21/3205
(52) U.S. Cl. ........................ 438/595; 438/243; 438/270; 438/424; 438/430; 438/589
(58) Field of Search ................................ 438/595, 589, 438/424, 430, 700, 243, 270, 386

(56) References Cited

U.S. PATENT DOCUMENTS

| | | | |
|---|---|---|---|
| 3,962,713 A | | 6/1976 | Kendall et al. |
| 4,409,608 A | | 10/1983 | Yoder |
| 4,614,021 A | | 9/1986 | Hulseweh |
| 4,630,088 A | | 12/1986 | Ogura et al. |
| 4,710,790 A | * | 12/1987 | Okamoto et al. ........... 438/589 |
| 4,864,375 A | | 9/1989 | Teng et al. |
| 4,882,291 A | * | 11/1989 | Jeuch ......................... 438/424 |

(List continued on next page.)

FOREIGN PATENT DOCUMENTS

| | | |
|---|---|---|
| DE | 44 43 968 A1 | 12/1994 |
| EP | 0 175 433 A2 | 4/1985 |
| EP | 0 315 803 A2 | 10/1988 |
| EP | 0 472 726 A1 | 3/1990 |
| EP | 0 575 278 A2 | 5/1993 |
| JP | 55-65463 A | 5/1980 |
| JP | 61144875 | 7/1986 |
| JP | 61-206253 | 9/1986 |
| JP | 63040376 | 2/1988 |
| JP | 4-34980 A | 2/1992 |
| JP | 04176168 | 6/1992 |
| JP | 4-268767 A | 9/1992 |
| JP | 5-121691 A | 3/1993 |

OTHER PUBLICATIONS

T. Hamamoto et al., "NAND–Structured Cell Technologies for Low Cost 256Mb DRAMs", IEEE (1993), pp. 643–646.

Primary Examiner—Michael Trinh
(74) Attorney, Agent, or Firm—Wells St. John P.S.

(57) ABSTRACT

The invention encompasses a method of forming an opening in a substrate. A first expanse of a first material is formed over the substrate, and such expanse comprises a sidewall edge. A second material is formed along the sidewall edge, and subsequently a second expanse of the first material is formed over the substrate and separated from the first expanse by the second material. The first and second expanses together define a mask. The second material is removed with an etch selective for the second material relative to the first material to form an opening extending through the mask. The substrate is etched through the opening in the mask to extend the opening into the substrate. In a particular embodiment of the invention, the opening is filled with insulative material to form a trenched isolation region. In another embodiment of the invention, the opening is filled with a conductive material to form a transistor gate.

17 Claims, 4 Drawing Sheets

U.S. PATENT DOCUMENTS

| | | | |
|---|---|---|---|
| 4,906,585 A | * 3/1990 | Neppl et al. | 438/221 |
| 4,951,102 A | 8/1990 | Beitman et al. | |
| 4,961,100 A | 10/1990 | Baliga et al. | |
| 4,982,266 A | 1/1991 | Chatterjee | |
| 5,010,386 A | 4/1991 | Groover, III | |
| 5,016,068 A | 5/1991 | Mori | |
| 5,122,476 A | 6/1992 | Fazan et al. | |
| 5,124,764 A | 6/1992 | Mori | |
| 5,281,837 A | 1/1994 | Kohyama | |
| 5,283,456 A | 2/1994 | Hsieh et al. | 257/347 |
| 5,298,780 A | 3/1994 | Harada | |
| 5,302,846 A | 4/1994 | Matsumoto | |
| 5,307,310 A | 4/1994 | Narita | |
| 5,312,782 A | 5/1994 | Miyazawa | |
| 5,340,754 A | 8/1994 | Witek et al. | |
| 5,340,759 A | 8/1994 | Hsieh et al. | |
| 5,355,330 A | 10/1994 | Hisamoto et al. | |
| 5,357,131 A | * 10/1994 | Sunami et al. | 257/301 |
| 5,360,753 A | * 11/1994 | Park et al. | 438/424 |
| 5,378,914 A | 1/1995 | Ohzu et al. | |
| 5,378,919 A | 1/1995 | Ochiai | |
| 5,443,992 A | 8/1995 | Risch et al. | |
| 5,480,838 A | 1/1996 | Mitsui | |
| 5,497,017 A | 3/1996 | Gonzales | |
| 5,508,541 A | 4/1996 | Hieda et al. | |
| 5,528,062 A | 6/1996 | Hsieh et al. | 257/301 |
| 5,529,948 A | 6/1996 | Lur et al. | |
| 5,563,083 A | 10/1996 | Pein | 437/43 |
| 5,573,837 A | * 11/1996 | Roberts et al. | 257/341 |
| 5,578,850 A | 11/1996 | Fitch et al. | |
| 5,616,961 A | 4/1997 | Kohyama | |
| 5,627,390 A | 5/1997 | Maeda et al. | |
| 5,627,393 A | 5/1997 | Hsu | |
| 5,693,547 A | 12/1997 | Gardner et al. | |
| 5,705,409 A | 1/1998 | Witek | |
| 5,712,500 A | 1/1998 | Hsue et al. | |
| 5,736,760 A | 4/1998 | Hieda et al. | 257/301 |
| 5,804,851 A | 9/1998 | Noguchi et al. | 257/304 |
| 5,929,476 A | 7/1999 | Prall | |

* cited by examiner

_Fig. 1_

_Fig. 2_

_Fig. 3_

_FIG 4_

_FIG 5_

_FIG 6_

METHODS OF FORMING DRAM ASSEMBLIES, TRANSISTOR DEVICES, AND OPENINGS IN SUBSTRATES

TECHNICAL FIELD

The invention pertains to methods of forming openings in substrates. The invention also pertains to methods of forming trenched isolation regions. Additionally, the invention pertains to methods of forming transistor devices, and to methods of forming DRAM assemblies.

BACKGROUND OF THE INVENTION

Numerous devices have been developed which can be formed within trenches in a semiconductive material wafer. Such devices include, for example, isolation regions and transistor gates. A difficulty in forming such devices is to minimize a width (or footprint) of a trench utilized for forming the devices.

Photolithographic processing is commonly utilized to define regions which are to be etched for formation of trenches, with the term "photolithographic processing" understood to refer to processes wherein a photosensitive layer is patterned with a masked beam of light. Difficulties in utilizing photolithographic processing are becoming prevalent with continued efforts to reduce device sizes. Specifically, the minimum feature dimension which can be produced by photolithographic processing is limited. It is desirable, therefore, to develop new methods for forming devices which can reduce a feature size beyond that achievable by photolithographic processing.

SUMMARY OF THE INVENTION

In one aspect, the invention encompasses a method of forming an opening in a substrate. A first expanse of a first material is formed over the substrate, and such expanse comprises a sidewall edge. A second material is formed alone the sidewall edge, and subsequently a second expanse of the first material is formed over the substrate and separated from the first expanse by the second material. The first and second expanses together define a mask. The second material is removed with an etch selective for the second material relative to the first material to form an opening extending through the mask. The substrate is etched through the opening in the mask to extend the opening into the substrate. In a particular embodiment of the invention, the opening is filled with insulative material to form a trenched isolation region. In another embodiment of the invention, the opening is filled with a conductive material to form a transistor gate.

BRIEF DESCRIPTION OF THE DRAWINGS

Preferred embodiments of the invention are described below with reference to the following accompanying drawings.

2

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
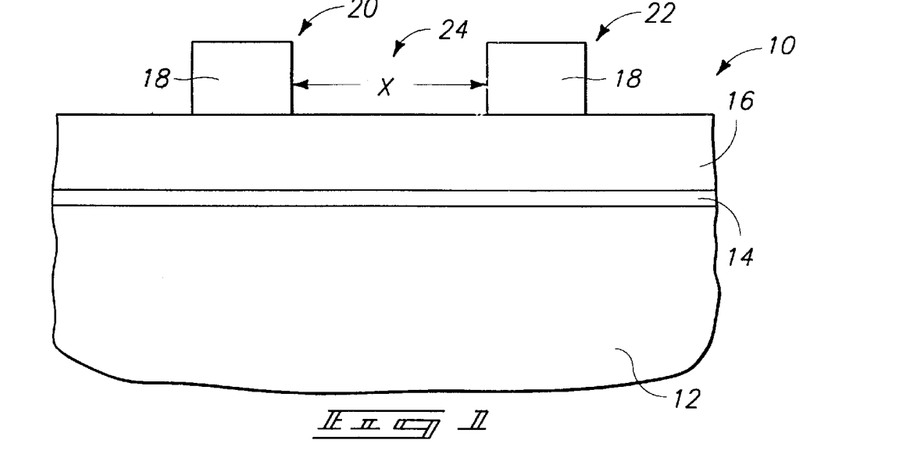
FIG. 1 is a diagrammatic, fragmentary, cross-sectional view of a semiconductor wafer fragment processed according a method of the present invention, and shown at a preliminary step of the method.

A method of the present invention is described with reference to FIGS. 1–7. Referring to FIG. 1, a semiconductor wafer fragment 10 comprises a substrate 12. Substrate 12 can comprise, for example, monocrystalline silicon lightly doped with a p-type background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A first layer 14 is formed over substrate 12, and a second layer 16 is formed over first layer 14. First layer 14 can comprise, for example, silicon nitride, and second layer 16 can comprise, for example, silicon dioxide. A patterned masking layer 18 is formed over second layer 16. Patterned masking layer 18 can comprise, for example, photoresist which has been patterned utilizing photolithographic processing technology. Patterned masking layer 18 is shown comprising a pair of blocks 20 and 22 which are separated by a gap 24 having a width "X". In particular embodiments of the invention, width "X" can correspond to a minimum feature size obtainable by the photolithographic processing utilized to form blocks 20 and 22. In the shown embodiment, width "X" is greater than such minimum feature size (as evidenced by width "X" being greater than a width to which blocks 20 and 22 have been patterned). Width "X" is shown to be greater than the widths of blocks 20 and 22 to simplify the illustrations of this disclosure, and not to imply any preference of a relative size of width "X" relative to the widths of blocks 20 and 22.

Figure 2:
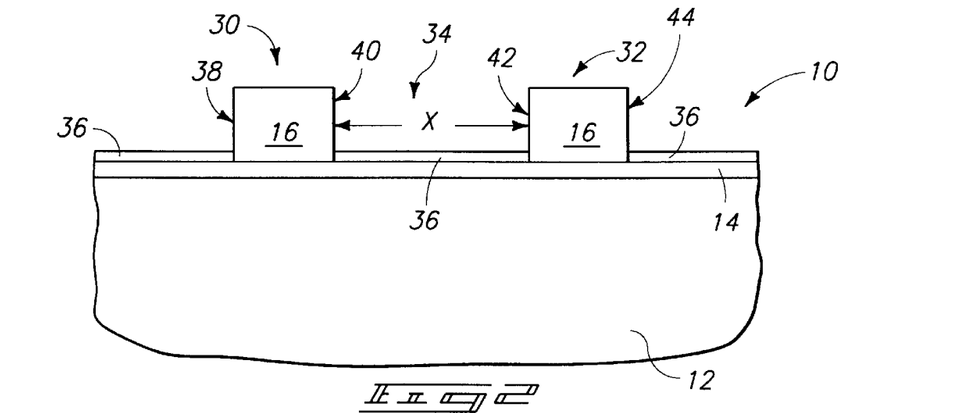
FIG. 2 is a view of the FIG. 1 wafer fragment shown at a processing step subsequent to that of FIG. 1.

Referring to FIG. 2, material 16 is etched to transfer a pattern from blocks 20 and 22 to material 16. In exemplary embodiments in which material 16 comprises silicon dioxide, a suitable etch can comprise a plasma etch utilizing one or more of $CF_4/H_2$, $C_2F_6$, $C_3F_6$, or $CHF_3$. After the etch of material 16, blocks 20 and 22 (FIG. 1) are removed, and material 16 comprises a pattern which defines a pair of blocks 30 and 32 (which can also be referred to as segments 30 and 32 in the discussion that follows). Blocks 30 and 32 comprise sidewall edges 38, 40, 42 and 44, with edge 40 of block 30 being separated from edge 42 of block 32 by a gap 34. Gap 34 comprises about the same distance as the distance "X" that had previously separated blocks 20 and 22 (FIG. 1) of masking layer 18. The distance between blocks 30 and 32 is described as being about the same as the distance "X" between blocks 20 and 22 (rather than as being exactly the same as such distance) to indicate that the transfer of a pattern from masking material 18 into layer 16 can be less than perfect. Imperfections in pattern transfer can result from, for example, an etch of layer 16 being less than perfectly anisotropic (and hence undercutting blocks 20 and 22).

A third layer 36 is selectively formed over first layer 14, and not over material 16. Layer 36 preferably comprises an oxidizable form of silicon. An exemplary oxidizable form of silicon is a non-oxidized silicon, such as, for example, polysilicon. In a particular embodiment, third layer 36 comprises polysilicon, first layer 14 comprises silicon nitride, and material 16 comprises silicon dioxide. In such embodiment, the polysilicon of third layer 36 can be selectively deposited over nitride 14, and not over silicon dioxide 16, by, for example, a deposition utilizing silane or disilane, a temperature of from about 600° C. to about 700° C., and a pressure of from about 0.1 mTorr to about 1 mTorr.

In the shown embodiment, third layer 36 is formed proximate blocks 30 and 32 by selective deposition of the material of layer 36 after formation of blocks 30 and 32. The invention encompasses other embodiments (not shown) wherein third layer 36 is provided before layer 16. In such other embodiments, layer 36 extends under blocks 30 and 32, as well as within the gap 34.

Figure 3:
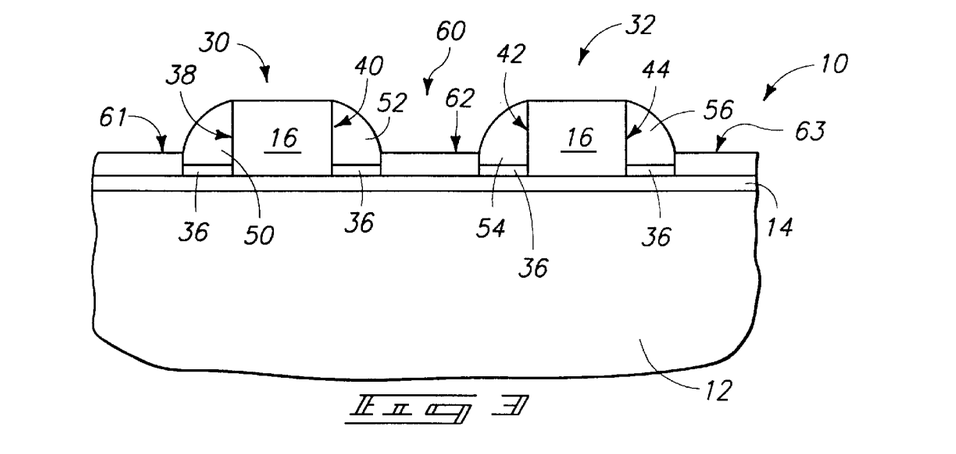
FIG. 3 is a view of the FIG. 1 wafer fragment shown at a processing step subsequent to that of FIG. 2.

Referring to FIG. 3, spacers 50, 52, 54 and 56 are formed along sidewall edges 38, 40, 42 and 44, respectively. Spacers 50, 52, 54 and 56 preferably comprise the same material as first layer 14. In an exemplary embodiment, spacers 50, 52, 54 and 56 comprise silicon nitride. Such spacers can be formed by, for example, chemical vapor deposition and subsequent anisotropic etching. The etching can be conducted utilizing one or more of $CF_4/O_2$, $CF_4/H_2$, $C_2F_6$, and $C_3F_8$.

Spacers 52 and 54 partially fill gap 34 (FIG. 2) to leave a narrowed gap 60 between blocks 30 and 32.

Portions of third material 36 are covered by spacers 50, 52, 54 and 56, and other portions are exposed between the spacers. The exposed portions are subjected to conditions which convert such portions to segments 61, 62 and 63 comprising a different chemical composition than the unexposed portions of material 36. In preferred embodiments, the exposed portions are converted to the same material that is comprised by first layer 16. For instance, in embodiments in which first layer 16 comprises silicon dioxide and third layer 36 comprises polyslicon, the exposed portions of third layer 36 can be converted to silicon dioxide segments 61, 62 and 63 by exposing the polysilicon of layer 36 to oxidizing conditions.

If blocks 30 and 32 and segments 62 comprise the same material, such material can be described as a first material, and the processing described above can be considered as forming a first material mask. Spacers 50, 52, 54 and 56 can then be considered as comprising a second material which extends through the first material mask. Further, the portions of polysilicon layer 36 that remain under spacers 50, 52, 54 and 56 can be considered as comprising a third material.

Another way of describing the structure of FIG. 3 is to identify one of blocks 30 and 32 as a first expanse of a first material. For instance, considering block 30 as a first expanse of a first material, then nitride sidewall 52 can be considered as a second material formed along a sidewall edge of the first expanse. Further, the segment 62 within narrowed gap 60 can be considered as a second expanse of the first material which is separated from the first expanse by the second material of spacer 52. The expanses defined by block 30 and segment 62 define a mask, and spacer 52 extends through such mask.

Figure 4:
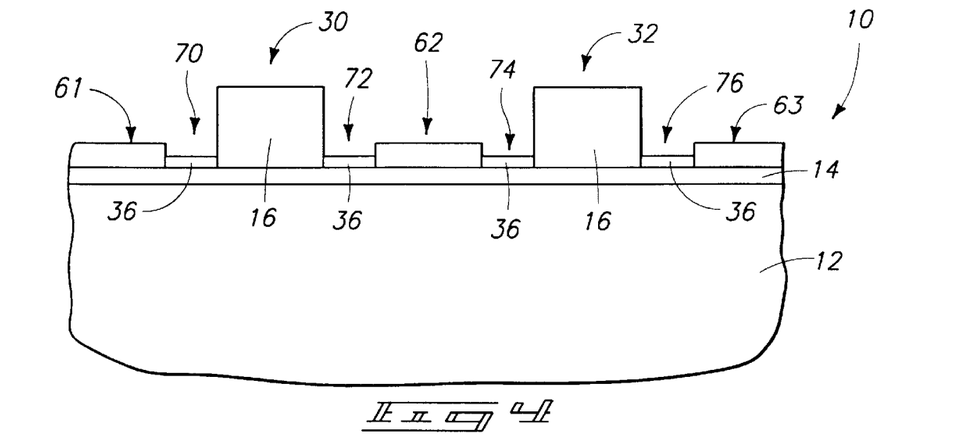
FIG. 4 is a view of the FIG. 1 wafer fragment shown at a processing step subsequent to that of FIG. 3.

Referring to FIG. 4, spacers 50, 52, 54 and 56 (FIG. 3) are removed. Such removal can be accomplished with an etch selective for the materials of the spacers relative to the material of segments 30, 32, 61, 62 and 63 (with blocks 30 and 32 now being referred to as segments 30 and 32). In embodiments in which the spacers comprise silicon nitride, and in which the segments 30, 32, 61, 62 and 63 comprise silicon dioxide, a suitable etch can comprise, for example, an ionized fluorinated chemical etchant. The removal of the spacers 50, 52, 54 and 56 leaves openings 70, 72, 74 and 76 extending through the mask defined by segments 30, 32, 61, 62 and 63.

Figure 5:
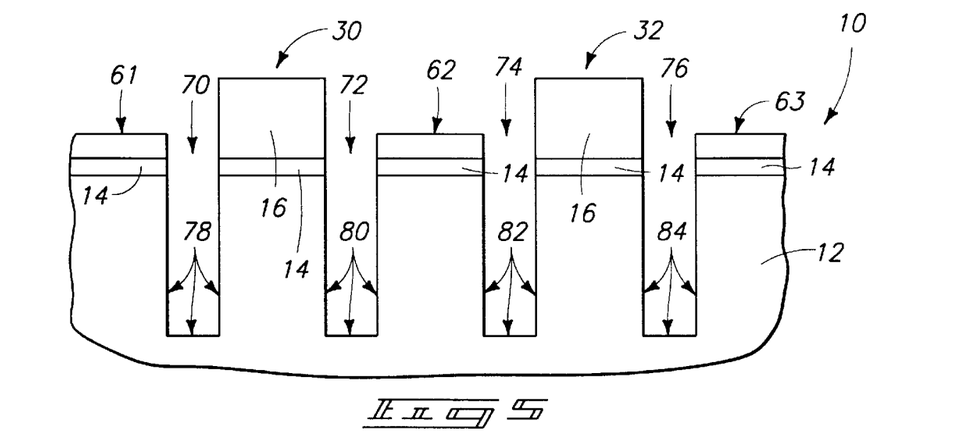
FIG. 5 is a view of the FIG. 1 wafer fragment shown at a processing step subsequent to that of FIG. 4.

Referring to FIG. 5, openings 70, 72, 74 and 76 are extended into substrate 12. In embodiments in which layer 14 comprises silicon nitride, layer 36 comprises polysilicon, and substrate 12 comprises monocrystalline silicon, the extension of openings 70, 72, 74 and 76 into substrate 12 can be accomplished by, for example, an etch utilizing a wet chemistry etchant followed by an etchant comprising an ionized fluorinated component. Openings 70, 72, 74 and 76 can comprise, for example, trenches. Such trenches have walls 78, 80, 82 and 84, respectively.

Figure 6:
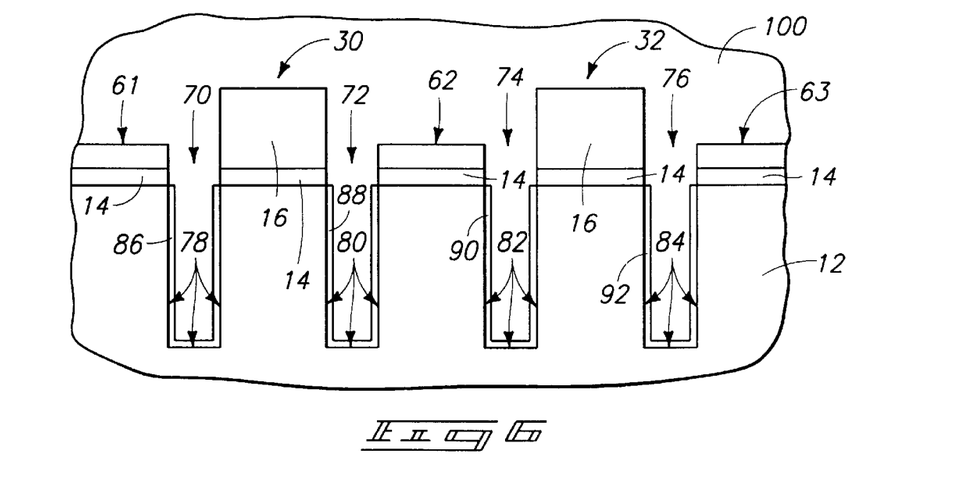
FIG. 6 is a view of the FIG. 1 wafer fragment shown at a processing step subsequent to that of FIG. 5.

Referring to FIG. 6, walls 78, 80, 82 and 84 of trenches 70, 72, 74 and 76 are oxidized to form silicon dioxide layers 86, 88, 90 and 92. Silicon dioxide layers 86, 88, 90 and 92 narrow openings 70, 72, 74 and 76, respectively. Silicon dioxide layers 86, 88, 90 and 92 can be formed by, for example, exposing monocrystalline substrate 12 to oxidizing conditions to thermally grow the silicon dioxide. Alternatively, silicon dioxide layers 86, 88, 90 and 92 can be formed by chemical vapor deposition. Although it is preferred that layers 86, 88, 90 and 92 comprise silicon dioxide, it is to be understood that other materials (preferably insulative materials) can be substituted for the silicon dioxide. For instance, silicon nitride can be formed within openings 70, 72, 74 and 76 instead of the silicon dioxide.

After the formation of layers 86, 88, 90 and 92, a material 100 is provided over substrate 12 and within openings 70, 72, 74 and 76. Material 100 can comprise either a conductive material or an insulative material. In embodiments in which trenches 70, 72, 74 and 76 are ultimately to be formed into isolation regions, material 100 can comprise an insulative material, such as, for example, silicon nitride or silicon dioxide. In particular embodiments, material 100 can comprise silicon dioxide formed utilizing a high density plasma. In the context of interpreting this document, a high density plasma is to be understood as a plasma having at least $10^{10}$ ions/cm$^3$. In embodiments in which electronic devices are to be formed within trenches 70, 72, 74 and 76, material 100 can comprise a conductive material, such as, for example, conductively doped polysilicon.

Figure 7:
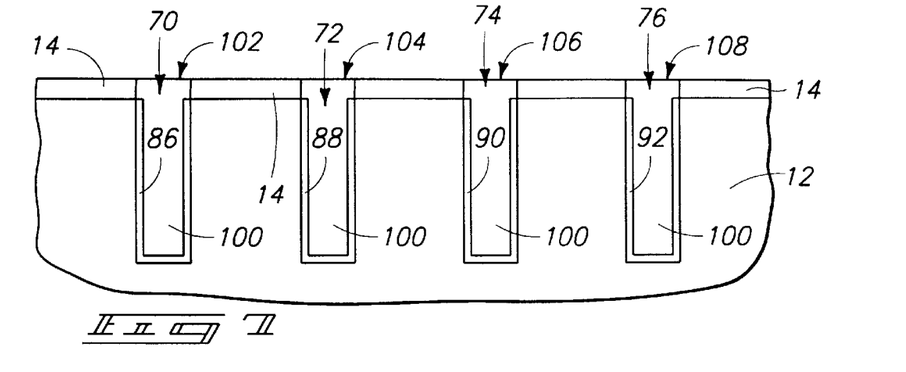
FIG. 7 is a view of the FIG. 1 wafer fragment shown at a processing step subsequent to that of FIG. 6.

Referring to FIG. 7, layer 14 is utilized as an etch stop during a polishing process. Such polishing process can comprise, for example, chemical-mechanical polishing, and removes segments 30, 32, 61, 62 and 63 (FIG. 6) from over substrate 12. The polishing also forms planarized upper surfaces 102, 104, 106 and 108 of material 100 within trenches 70, 72, 74 and 76, respectively. The planarized upper surfaces 102, 104, 106 and 108 are coextensive with one another, and coextensive with a planarized upper surface of layer 14. In embodiments in which material 100 comprises an insulative material, such as, for example, silicon dioxide, trenches 70, 72, 74 and 76 now comprise trenched isolation regions. In embodiments in which material 100 comprises a conductive material, such as, for example, conductively doped polysilicon, and in which it is desired to incorporate the material 100 into gate structures of transistor devices, further processing is required.

Figure 8:
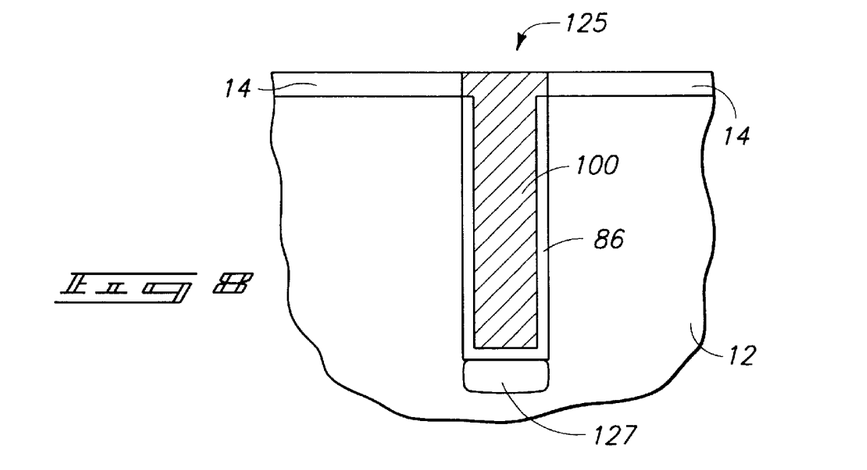
FIG. 8 is a view of the FIG. 1 wafer fragment shown at a processing step subsequent to that of FIG. 7, and shown in a particular aspect of the invention wherein a transistor device is formed.
Figure 9:
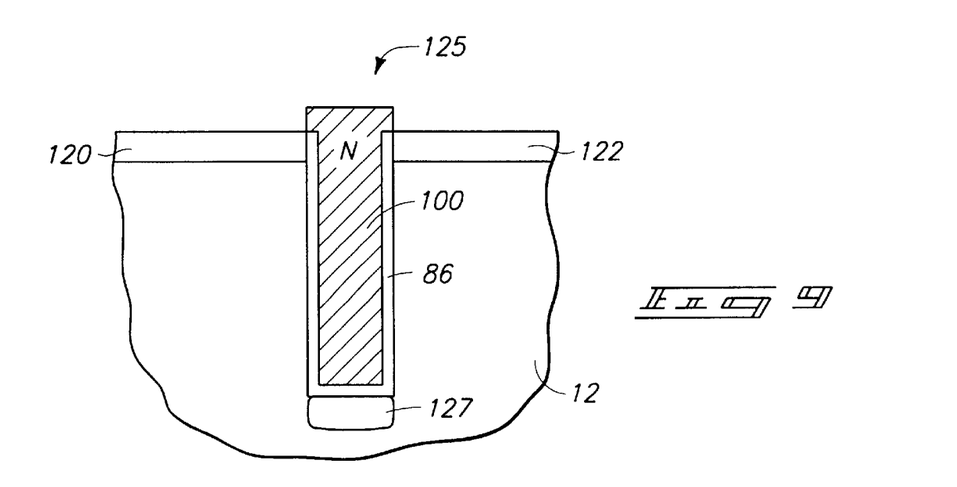
FIG. 9 is a view of the FIG. 1 wafer fragment shown at a processing step subsequent to that of FIG. 8.
Figure 10:
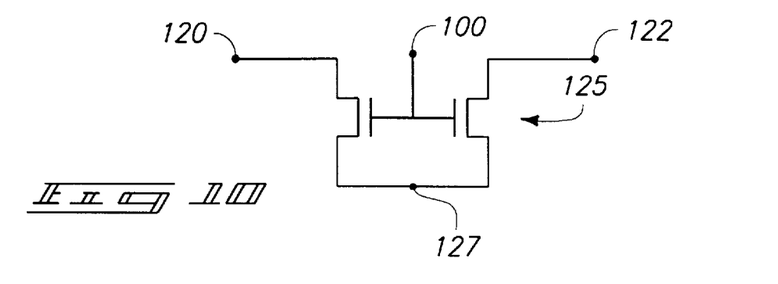
FIG. 10 is an electrical circuit view of the FIG. 9 construction.

FIGS. 8–10 illustrate further processing which can be utilized to incorporate material 100 into a gate of a transistor structure 125. FIG. 8 shows a fragment of the structure of FIG. 7 comprising trench 70. In the embodiment of FIG. 8, material 100 is shown as a conductive material, such as, for example, conductively doped polysilicon. A diffusion region 127 (preferably doped to a concentration of at least $10^{19}$ atoms/cm$^3$ with n-type conductivity-enhancing dopant) is formed beneath material 100. Such diffusion region can be formed by, for example, out-diffusion from conductively a doped material 100, or implanting through the bottom of opening 70 (FIG. 6). Diffusion region 127 has a floating voltage, and functions as a floating connector for transistor structure 125.

Referring to FIG. 9, source/drain regions 120 and 122 have been implanted into substrate 12, and layer 14 has been removed from over substrate 12. Source/drain regions 120 and 122 can comprise, for example, n-type conductivity enhancing dopant provided to a concentration of greater than $10^{19}$ atoms/cm$^3$, and can be provided before or after removal of layer 14. A DRAM assembly can be constructed utilizing the transistor of FIG. 9 by connecting a bitline to one of source/drain regions 120 and 122, and by connecting a capacitor to the other of source/drain regions 120 and 122.

FIG. 10 shows an electronic circuit diagram of the construction of FIG. 9.

Figure 11:
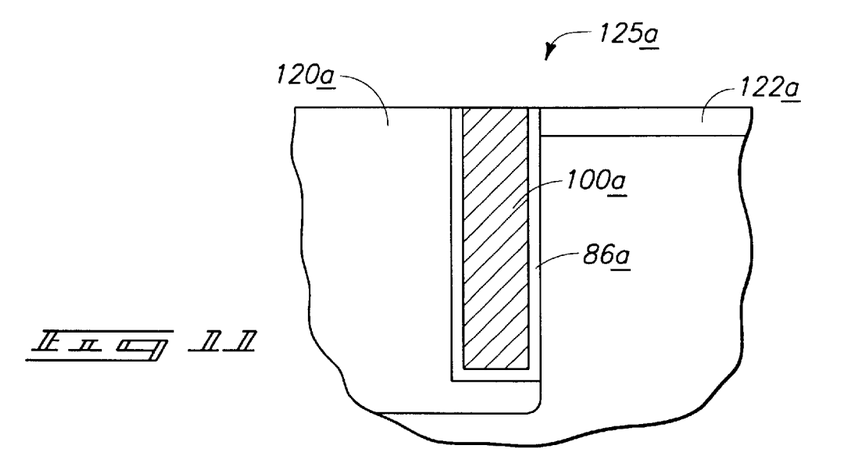
FIG. 11 is a view of the FIG. 1 wafer fragment shown at a processing step subsequent to that of FIG. 7, and shown in another aspect of the invention wherein a transistor device is formed.
Figure 12:
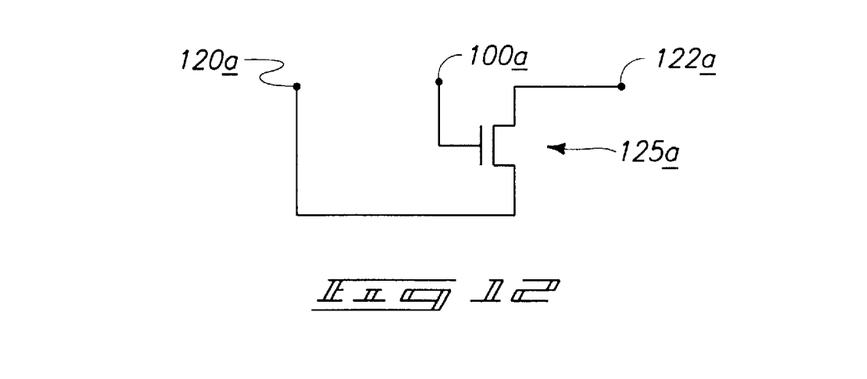
FIG. 12 is an electrical circuit view of the FIG. 11 construction.

FIGS. 11 and 12 illustrate an alternative method by which further processing can be utilized to form a gate of a transistor structure. In referring to FIGS. 11 and 12, similar number will be utilized as was used describing FIGS. 8–10, with the suffix "a" utilized to indicate structures shown in FIGS. 11 and 12.

FIG. 11 shows a fragment of the structure of FIG. 7 comprising a trench 70a (corresponding to the trench 70 of FIG. 7), in a substrate 12a. In the embodiment of FIG. 11, a conductive material 100a is formed within trench 70a. Such conductive material can comprise, for example, conductively doped polysilicon. Source/drain regions 120a and 122a have been implanted into substrate 12a, and layer 14 (FIG. 7) has been removed from over substrate 12a. Source/drain regions 120a and 122a can comprise, for example, n-type conductivity enhancing dopant provided to a concentration of greater than $10^{19}$ atoms/cm$^3$, and can be provided before or after removal of layer 14. Conductive material 100a, together with source/drain regions 120a and 122a, defines a transistor 125a. A DRAM assembly can be constructed utilizing the transistor 125a of FIG. 11 by connecting a bitline to one of source/drain regions 120a and 122a, and by connecting a capacitor to the other of source/drain regions 120a and 122a.

FIG. 12 shows an electronic circuit diagram of the construction of FIG. 11.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an opening in a substrate, comprising:

forming at least two blocks of a first material over a substrate, a pair of the at least two blocks being separated by a gap and comprising sidewall edges;

forming spacers of a second material along the sidewall edges, the spacers only partially filling the gap and leaving a remaining portion of the gap unfilled;

forming a layer of the first material within the unfilled remaining portion of the gap, the first material of the blocks and the first material within the gap together defining a mask;

removing the second material spacers with an etch selective for the second material relative to the first material to form openings extending through the mask;

etching the substrate through the openings in the mask to form an opening into the substrate, the method further comprising;

before forming the first material blocks, forming a layer of second material over the substrate;

forming the first material blocks and the second material spacers over the layer of second material; and etching the layer of second material through the openings in the mask.

2. A method of forming an opening in a substrate, comprising:

forming at least two blocks of a first material over a substrate, a pair of the at least two blocks being separated by a gap and comprising sidewall edges;

forming spacers of a second material along the sidewall edges, the spacers only partially filling the gap and leaving a remaining portion of the gap unfilled;

forming a layer of the first material within the unfilled remaining portion of the gap, the first material of the blocks and the first material within the gap together defining a mask;

removing the second material spacers with an etch selective for the second material relative to the first material to form openings extending through the mask;

etching the substrate through the openings in the mask to form an opening into the substrate, the method further comprising;

before forming the second material spacers, forming a layer of the second material over the substrate and forming a layer of a third material over the layer of second material;

forming the second material spacers over the layer of the third material; and removing portions of the layer of third material and portions of the layer of second material through the openings in the mask.

3. The method of claim 2 wherein the substrate comprises monocrystalline silicon, the first material comprises silicon dioxide, the second material comprises silicon nitride, and the third material comprises silicon, and wherein the silicon of the third material is oxidized to form the silicon dioxide first material within the gap.

4. The method of claim 3 wherein the silicon of the third material is in the form of polycrystalline silicon.

5. A method of forming a trench in a semiconductive material substrate, comprising:
   providing a semiconductive material substrate;
   forming a silicon nitride layer over the substrate;
   forming at least two blocks over the silicon nitride layer, the at least two blocks comprising silicon dioxide, a pair of the at least two blocks being separated by a gap and comprising sidewall edges;
   forming a non-oxidized silicon layer over the silicon nitride layer and proximate the at least two blocks;
   forming silicon nitride spacers along the sidewall edges and over a portion of the non-oxidized silicon layer, the spacers only partially filling the gap to leave a narrowed gap between the pair of blocks, the narrowed gap having an other portion of the non-oxidized silicon layer exposed therein;
   oxidizing said other portion of the non-oxidized silicon layer to convert the exposed non-oxidized silicon to silicon dioxide;
   removing the silicon nitride spacers with an etch selective for silicon nitride relative to the silicon dioxide; the removing of the silicon nitride spacers leaving a silicon dioxide mask over the semiconductive material substrate, the silicon dioxide mask comprising the pair of blocks and the silicon dioxide formed within the gap by oxidizing the exposed non-oxidized silicon, the silicon dioxide mask having openings extending therethrough corresponding to the locations from which the silicon nitride spacers were removed;
   removing portions of the non-oxidized silicon layer and silicon nitride layer exposed through the openings in the silicon dioxide mask; and
   removing portions of the substrate exposed through the openings in the silicon dioxide mask to form at least one trench extending into the substrate.

6. The method of claim 5 wherein the non-oxidized silicon comprises polysilicon.

7. The method of claim 5 further comprising filling the trench in the substrate with an insulative material to form a trenched isolation region.

8. The method of claim 5 further comprising:
   filling the trench in the substrate with silicon dioxide; and
   utilizing the silicon nitride layer over the substrate as an etch stop during a polishing process to form a planarized upper surface over the substrate.

9. The method of claim 8 wherein the silicon dioxide is formed in the trench by high density plasma silicon dioxide deposition.

10. The method of claim 8 wherein the substrate comprises silicon and the filling the trench with silicon dioxide comprises:
    thermally growing a thin layer of oxide over walls of the silicon-comprising substrate within the trench to partially fill the trench; and
    deposition of high density plasma silicon dioxide to fill a remainder of the partially filled trench.

11. A method of forming a transistor device supported by a semiconductive material substrate, comprising:
    providing a semiconductive material substrate;
    forming at least two blocks over the substrate, the at least two blocks comprising silicon dioxide, a pair of the at least two blocks being separated by a gap and comprising sidewall edges;
    forming a silicon layer over the substrate and proximate the at least two blocks;
    forming silicon nitride spacers along the sidewall edges and over a portion of the silicon layer, the spacers only partially filling the gap to leave a narrowed gap between the pair of blocks, the narrowed gap having an other portion of the silicon layer exposed therein;
    oxidizing said other portion of the silicon layer to convert the exposed silicon to a silicon dioxide segment;
    removing the silicon nitride spacers with an etch selective for silicon nitride relative to silicon dioxide; the removing of the silicon nitride spacers leaving a silicon dioxide mask over the semiconductive material substrate, the silicon dioxide mask comprising the pair of blocks and the silicon dioxide segment formed within the gap by oxidizing the exposed silicon, the silicon dioxide mask having openings extending therethrough corresponding to the locations from which the silicon nitride spacers were removed;
    removing portions of the silicon layer and silicon nitride layer exposed through the openings in the silicon dioxide mask;
    removing portions of the substrate exposed through the openings in the silicon dioxide mask to form at least one trench extending into the substrate, the trench having walls;
    forming an insulative material over the trench walls to partially fill the trench and leaving a narrowed opening within the trench;
    filling the narrowed opening with a conductive material; and
    forming source/drain regions extending into the substrate and separated from the conductive material by the insulative material over the trench walls; the conductive material and source/drain regions together comprising a transistor device.

12. The method of claim 11 wherein the silicon layer comprises polysilicon.

13. The method of claim 11 wherein the substrate comprises silicon, and wherein the forming the insulative material over the trench walls comprises oxidizing the silicon of the trench walls to form silicon dioxide.

14. The method of claim 11 wherein the filling the narrowed trench with conductive material comprises filling the narrowed trench with conductively doped polysilicon.

15. The method of claim 11 wherein the forming the source/drain regions comprises:
    removing the silicon dioxide blocks and silicon dioxide segment from over the substrate; and
    implanting a conductivity-enhancing dopant into the substrate to form source/drain regions proximate the conductive material.

16. The method of claim 11 wherein the conductive material formed within the trench comprises conductively doped polysilicon, and the method further comprising forming a diffusion region beneath the conductively doped polysilicon.

17. The method of claim 11 wherein the conductive material formed within the trench comprises conductively doped polysilicon, and wherein one of the source/drain regions extends to beneath the conductively doped polysilicon.

* * * * *

UNITED STATES PATENT AND TRADEMARK OFFICE
CERTIFICATE OF CORRECTION

PATENT NO. : 6,500,744 B2  Page 1 of 1
DATED : December 31, 2002
INVENTOR(S) : Fernando Gonzalez and Er-Xuan Ping

It is certified that error appears in the above-identified patent and that said Letters Patent is hereby corrected as shown below:

Column 1,
Line 39, replace "alone the sidewall edge, and subsequently a second expanse" with
-- along the sidewall edge, and subsequently a second expanse --

Column 3,
Line 2, replace "one or more of $CF_4/H_2$, $C_2F_6$, $C_3F_6$, or $CHF_3$. After the etch"
with -- one or more of $CF_4/H_2$, $C_2F_6$, $C_3F_8$, or $CHF_3$. After the etch --
Line 44, replace "54 and 56 comprise silicon nitridc. Such spacers can be" with
-- 54 and 56 comprise silicon nitride. Such spacers can be --

Signed and Sealed this

Fifteenth Day of July, 2003

JAMES E. ROGAN
*Director of the United States Patent and Trademark Office*